United States Patent [19]
White

[11] Patent Number: 5,526,874
[45] Date of Patent: Jun. 18, 1996

[54] HEAT SINK RETENTION APPARATUS AND METHOD

[75] Inventor: Nikolas F. White, Austin, Tex.

[73] Assignee: Dell USA, L.P., Austin, Tex.

[21] Appl. No.: 158,668

[22] Filed: Nov. 19, 1993

[51] Int. Cl.$^6$ .................................................. H05K 7/20
[52] U.S. Cl. .................. 165/80.3; 29/426.6; 257/719; 361/704
[58] Field of Search .................... 24/543, 563, 634, 24/458, 459; 165/80.3, 185; 174/16.3; 361/704, 719; 257/719; 29/426.6

[56] References Cited

U.S. PATENT DOCUMENTS

| | | | |
|---|---|---|---|
| 2,816,340 | 12/1957 | Domenech et al. | 24/634 X |
| 3,225,952 | 12/1965 | Stiles | 24/563 X |
| 3,711,905 | 1/1973 | Eckerdt et al. | 24/563 |
| 4,745,456 | 5/1988 | Clemens | 357/79 |
| 5,276,585 | 1/1994 | Smithers | 361/704 |
| 5,329,426 | 7/1994 | Villani | 361/719 |
| 5,396,402 | 3/1995 | Perugini et al. | 361/704 |

*Primary Examiner*—Allen J. Flanigan
*Attorney, Agent, or Firm*—Henry N. Garrana; Michelle M. Turner; Mark P. Kahler

[57] ABSTRACT

Disclosed are an apparatus and method for coupling a heat sink to a heat-producing electronic component, such as a microprocessor, into an assembly. The apparatus comprises: (1) a resilient clip member having a central, substantially arcuate portion of a selected radius of curvature, the arcuate portion thereby having a concave surface and a convex surface, the clip member further having an opposing pair of end portions bent with respect to the arcuate portion toward the concave surface, the end portions substantially parallel to one another, the end portions further including inwardly-facing projections for engaging with a lower surface of the component and (2) a fulcrum member coupled to a selected point on the concave surface of the clip member, the fulcrum member urging against an upper surface of the heat sink when pressure is applied to the convex surface of the arcuate portion, the arcuate portion flattening, the end members rotating outwardly with respect to one another to thereby disengage the inwardly-facing projections from the lower surface, the apparatus thereby free to be removed from the assembly. The arcuate portion cooperates with the fulcrum member to allow removal of the apparatus without requiring use of a tool.

32 Claims, 2 Drawing Sheets

HEAT SINK RETENTION APPARATUS AND METHOD

TECHNICAL FIELD OF THE INVENTION

The present invention is directed, in general, to a cooling system for computer systems and, more specifically, to a retaining apparatus for mounting a heat sink proximate to a heat-producing electronic component within the computer system, the apparatus able to be removed by hand and without requiring a tool therefor.

BACKGROUND OF THE INVENTION

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges. This reduces a chance that the components will fail immediately or have too short a lifetime.

In early desktop personal computers, components were passively cooled by radiation or convection, the surfaces of the components themselves interfacing directly with still air surrounding the component to transfer heat thereto. Unfortunately, air is not a particularly good conductor of heat. Therefore, in the early desktop computers, the heated air tended to become trapped, clinging to the components, acting as a thermal insulator and increasing component operating temperature. Eventually, computers were provided with fans to force air over the surfaces of the components, increasing the temperature differential between the surface of the component and the surrounding air to increase the efficiency of hem transfer. The increased temperature differential overcame some of the poor heat-conducting qualities of air.

Of all components in a computer, the microprocessor central processing unit ("CPU") liberates the most heat during operation of the computer. This springs from its role as the electrical center of attention in the computer. Thus, in prior art computers, motherboards were designed to position the CPU in the flow of air from a cooling fan; other heat-producing components were located away from the CPU to afford maximum cooling of the CPU.

As new generations of microprocessors have arrived, however, this relatively simple scheme has become decidedly inadequate, risking destruction of the CPU. It has become common to associate a heat sink with the CPU to increase the heat-dissipating surface area of the CPU for more effective cooling. Such heat sinks have a plurality of heat-dissipating projections or elements on a surface thereof (an "upper surface," for purposes of discussion). Another surface of the heat sink (the "lower surface") is placed proximate the component and a retention clip is employed to wrap around the heat sink, gripping a lower surface of the component with inward-facing projections.

Prior art retention clips are of two varieties. The first has the profile of a staple, having a flattened center section, two downward-turning end portions and two inward-directed projections to grip an underside of the component. The second has a "V" shaped center section, two downward-turning end portions and two inward-directed projections. A center point of the "V" section contacts and urges against the upper surface of the heat sink, cooperating with the projections to hold the heat sink to the component. The remainder of the "V" section does not contact the upper surface of the heat sink.

Heat sinks are provided with an area on the upper surface where the projections are removed to allow the retention clip to lay directly on the base of the heat sink. The projectionless area is made as small as possible to maximize heat sink surface area. The retention clip is therefore substantially recessed in the projections.

Since the retention clip is recessed in the projections, removal of prior art retention clips presents a problem. Both of the above-described prior art clips require a pulling force for removal. The force either had to be applied to the end portions to rotate one projection from its engagement with the underside of the component or to the central portion to bend an end portion, tilting its associated projection and causing its disengagement. In the past, a prying tool, such as a screwdriver, had to be wedged between the clip and the heat sink or component to exert the required force. Because the clip is recessed between the projections of the heat sink, wedging the tool under the clip is difficult. Likewise, it is difficult to wedge a tool under the end portions.

In many applications, the heat sink has a length and width in excess of that of the component to further maximize surface area. In such cases, apertures are provided in the heat sink for receiving the end portions therethrough. With such heat sinks, it is very difficult to wedge a prying tool under the end portions.

What is needed in the art is a heat sink retention clip or apparatus that does not require a prying tool to remove. More specifically, what is needed is a retention apparatus that can be remove by hand.

SUMMARY OF THE INVENTION

To address the above-discussed deficiencies of the prior art, it is a primary object of the present invention to provide a retention clip apparatus that does not require a prying tool, such as a flat head screwdriver, or dedicated tool for removal thereof. Accordingly, the present invention provides an apparatus comprising: (1) a resilient clip member having a central, substantially arcuate portion of a selected radius of curvature, the arcuate portion thereby having a concave surface and a convex surface, the clip member further having an opposing pair of end portions bent with respect to the arcuate portion toward the concave surface, the end portions substantially parallel to one another, the end portions further including inwardly-facing projections for engaging with a lower surface of the component and (2) a fulcrum member coupled to a selected point on the concave surface of the clip member, the fulcrum member urging against an upper surface of the heat sink when pressure is applied to the convex surface of the arcuate portion, the arcuate portion flattening, the end members rotating outwardly with respect to one another to thereby disengage the inwardly-facing projections from the lower surface, the apparatus thereby free to be removed from the assembly. The arcuate portion cooperates with the fulcrum member to allow removal of the apparatus without requiring use of a dedicated tool. The arcuate portion is advantageously designed to receive pressure from a human digit, although a tool for delivering pressure to the arcuate portion can be used in lieu of the digit.

In one embodiment of the present invention, the apparatus further comprises a lever member extending from the convex surface to thereby allow a lifting force to be exerted on the apparatus to assist in the removal of the apparatus from the assembly. If a person is using a human digit to depress the arcuate portion, the person can use another digit to press against an underside of the lever member to lift the apparatus away from the upper surface. In this embodiment, the arcuate portion, the fulcrum member and the lever member cooperate to cause removal of the apparatus.

In another embodiment, the radius of curvature of the arcuate portion is selected to be infinite (flattening the arcuate portion) and the fulcrum member is eliminated. In this embodiment, the lever member alone functions to allow a human digit to bend the arcuate portion of the apparatus back to rotate the end portions with respect to one another to thereby release the apparatus from the assembly.

In yet another embodiment, the apparatus comprises a second fulcrum member coupled to a second selected point on the concave surface of the clip member to thereby increase the outward rotation of the end portions with respect to one another when the pressure is applied, further easing removal of the apparatus.

In still another embodiment, two separate lever members are provide on the arcuate portion. The two lever members allow a first human digit to depress the arcuate portion and two opposing digits to grasp respective lever members to lift the apparatus from the assembly.

In yet another embodiment, the apparatus has both two fulcrum members and two lever members, allowing for extreme ease of removal.

Although the retention apparatus of the present invention can be employed in many environments to hold assemblies of parts or elements together, the present invention is particularly useful for removably fixing a heat sink to a heat-producing electronic component. In such an environment, the "lower surface" and "upper surface" as recited above are a lower surface of the component and an upper surface of the heat sink, respectively.

When the heat sink is provided with apertures to allow a retention clip to pass therethrough, the end portions of the apparatus of the present invention extend through the apertures to grip the component beneath.

As stated previously, the heat sink is provided with projections or heat dissipating elements that extend from the upper surface of the heat sink. These projections or elements may be in the form of fins or fingers. The retaining clip apparatus of the present invention is designed to recess into the interstices between projections. A sufficiently narrow human digit can still access the arcuate portion of and lever member(s) on the apparatus to remove same.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
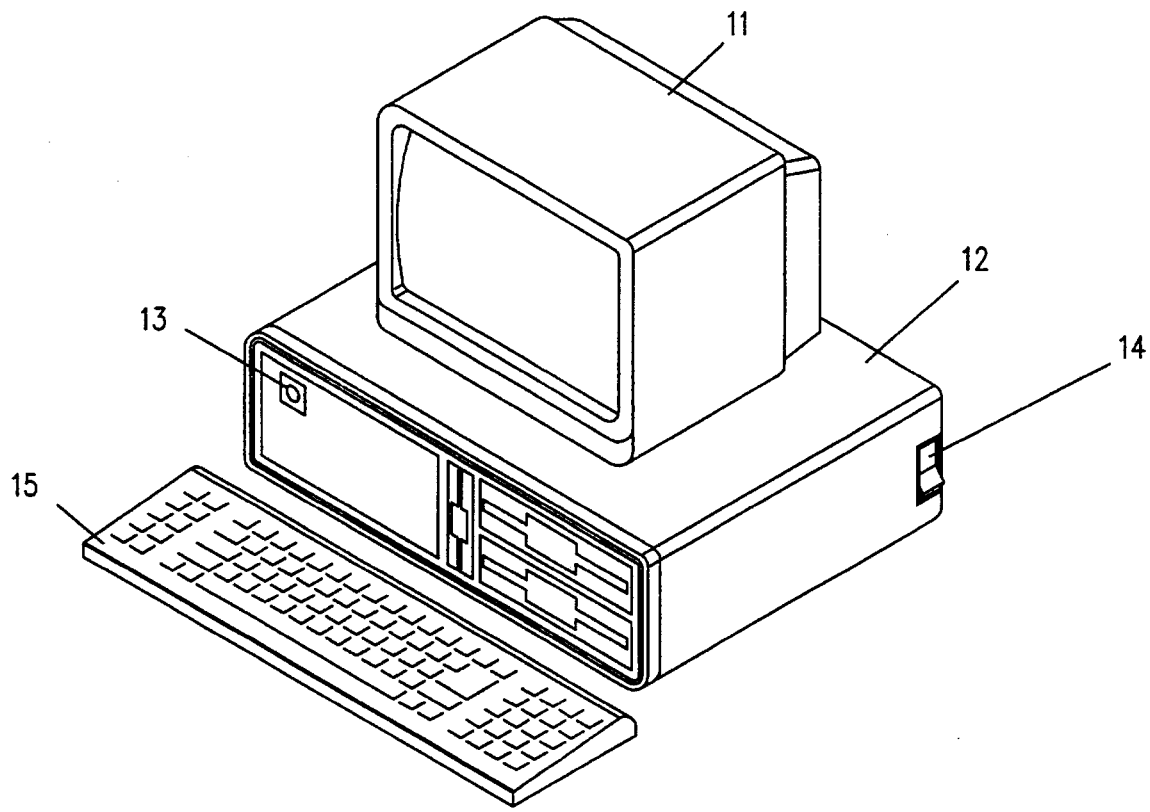
FIG. 1 illustrates an isometric view of a personal computer that provides an environment within which the present invention can operate.

Referring initially to FIG. 1, illustrated is an isometric view of a personal computer ("PC") 10 that provides an environment within which the present invention can operate. Since the present invention is not limited to application in a PC environment, however, FIG. 1 is illustrative only. The PC 10 includes a monitor 11, a main chassis 12, within which are various electronic components of the computer (not show, a, but including the microprocessor CPU) and a keyboard 15. The monitor 11 and the keyboard 15 cooperate to allow communication between the PC 10 and a user. The main chassis 12 includes a dedicated hardware reset switch 13 adapted to trigger hardware reset circuitry (not shown) within the main chassis 12 to "reboot" or restart the PC 10 when the user depresses the reset switch 13. The main chassis 12 further includes a power switch 14 that is capable of interrupting power to the PC 10.

Figure 2:
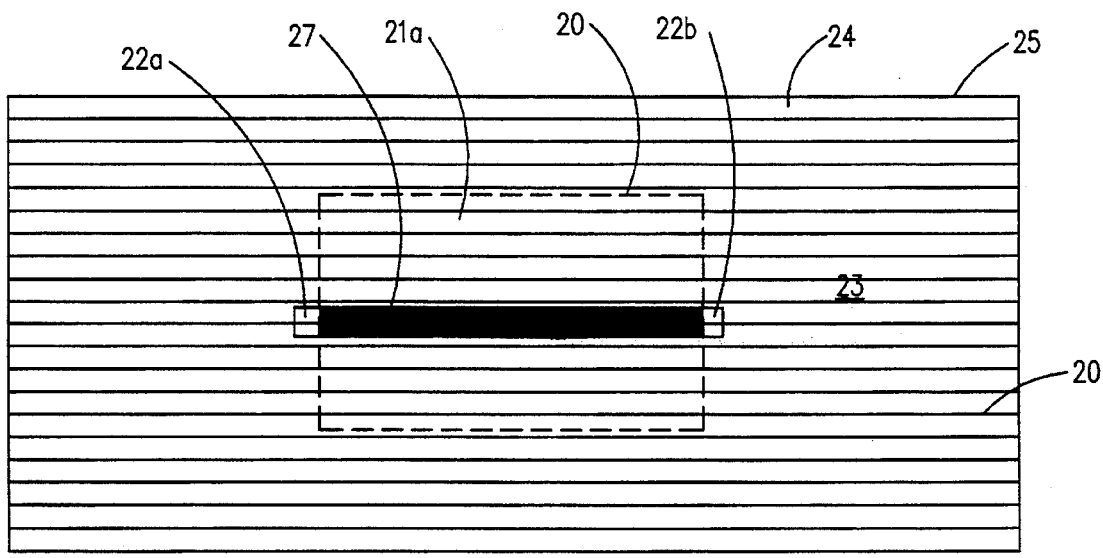
FIG. 2 illustrates a plan view of a heat sink/component assembly that forms an environment within which the retention apparatus of the present invention can operate.

Turning now to FIG. 2, illustrated is a plan view of a heat sink/component assembly that forms an environment within which the retention apparatus of the present invention can operate. Shown in broken line is a heat-producing electronic component 20 that may be the microprocessor CPU of the PC 10 of FIG. 1. The component 20 liberates heat therefrom during operation via an upper surface 21a and a lower surface (not shown in FIG. 2, but shown and referenced in FIG. 3 as 21b). However, the component 20 is mounted on a circuit board (not shown), so the lower surface of the component does not play a substantial role in removing heat from the component 20.

As stated previously, it has become commonplace to augment the heat-liberating capacity of the upper surface 21a with a heat sink. Accordingly, FIG. 2 shown a heat sink 23 having an upper surface 24 and a lower surface 25. A plurality of projections 26 are fixed to the upper surface 24. The projections 26 increase the surface area of the upper surface 24, increasing heat transfer from the heat sink 23. The projections 26 may be in the form of parallel ribs or fins, or may be finger-like structures. The form of the projections 26 is not pertinent to the present invention. The heat sink 23 removes heat from the component 20 via the upper surface 21 a of the component 20 and the lower surface 25 of the heat sink 23. It is vital, therefore, to maintain reliable thermal communication between the upper surface 21a of the component 20 and the lower surface 25 of the heat sink 23. Together, the component 20 and the heat sink 23 are referred to as an "assembly."

As previously stated, the prior art has provided retention clips that urge against the upper surface 24 of the heat sink 23 and, via inward-facing projections, the lower surface (21b in FIG. 3) of the component 20. Unfortunately, removal of prior art retention clips required a prying tool and risked damage to either the component 20, the heat sink 23 or both. The present invention introduces a retention clip apparatus 27 that does not require a tool for removal thereof. The retention clip apparatus 27 of the present invention is illustrated more particularly in two embodiments in FIGS. 3 and 4.

The heat sink 23 is shown in FIG. 2 as having a greater length and width than the component 20. Accordingly, the heat sink 23 is provided with a pair of apertures 22a, 22b to receive the retention clip apparatus 27 therethrough, allowing the retention clip apparatus 27 to grip the component 20.

Figure 3:
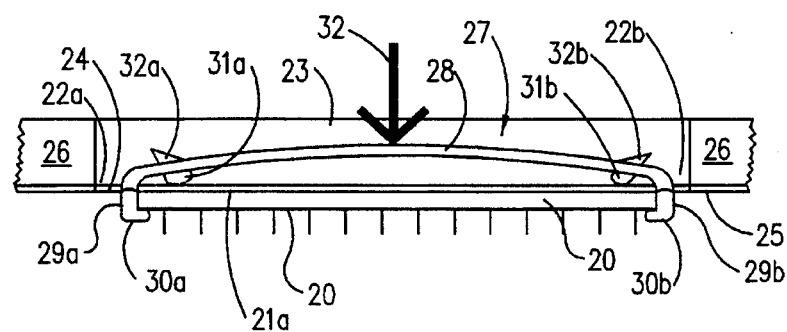
FIG. 3 illustrates an elevational view of one embodiment of the retention apparatus of the present invention.

Turning now to FIG. 3, illustrated is an elevational view of one embodiment of the retention apparatus of the present invention. The present invention, in contrast to the prior art, provides a retention clip apparatus 27 comprising a clip member having a central, substantially arcuate portion 28 of a selected radius of curvature. The arcuate portion 28 therefore has a concave surface and a convex surface (not separately referenced). An opposing pair of end portions 29a, 29b are bent with respect to the arcuate portion 28 toward the concave surface and are substantially parallel to one another. The end portions 29a, 29b further include inwardly-facing projections 30a, 30b for engaging with the lower surface 21b of the component 20.

FIG. 3 also shows a pair of fulcrum members 31a, 31b coupled to selected points on the concave surface of the arcuate portion 28. Each fulcrum member 31a, 31b urges against the upper surface 25 of the heat sink 22 when pressure (represented by an arrow 32) is applied to the convex surface of the arcuate portion 28 of the clip member. Pressure applied to the arcuate portion 28 causes the fulcrum members 31a, 31b to urge against the upper surface 24 of the heat sink 23, causing the arcuate portion 28 to flatten and lengthen. This flattening and lengthening, in turn, produces two effects in the end portions 29a, 29b. First, the end portions 29a, 29b rotate outward with respect to one another as the arcuate portion 28 flattens. Second, the end portions 29a, 29b separate with respect to one another as the arcuate portion 28 lengthens. The separation and the rotation of the end portions 29a, 29b combine to cause the projections 30a, 30b to disengage front the lower surface 21b of the component 20, the apparatus 27 thereby free to be removed from the assembly.

Removal of the apparatus 27 is effected by providing a lifting force on one or both of a pair of lever members 32a, 32b extending from the upper surface of the arcuate portion 28 at selected points thereon. Thus, while one human digit provides a downward force on the arcuate portion 28, two other digits can grasp the lever members 32a, 32b to lift the apparatus 27. Thus, the present invention provides a handle on the retention clip apparatus 27 for allowing the apparatus 27 to be lifted from the assembly.

Those skilled in the art will realize that the retention clip of the present invention can function without all of the elements illustrated in FIG. 2. First, one or both of the lever members 32a, 32b can be eliminated. Total elimination of the lever members 32a, 32b makes lifting of the apparatus 27 from the assembly more difficult, but does not compromise one's ability to disengage the apparatus 27 from the assembly without a prying tool. Elimination of one of the lever members 32a, 32b still allows one to provide a downward force on the arcuate portion 28 with a human digit and a lifting force on the remaining lever member with another digit.

Second, one or both of the fulcrum members 31a, 31b can be eliminated. The fulcrum members accentuate the flattening and lengthening of the arcuate portion 28 when pressure is applied.

Elimination of one of the fulcrum members 31a, 31b still allows one of the end members 29a, 29, providing sufficient displacement for an associated projection 30a, 30b to rotate to disengage the apparatus 27. Elimination of both of the fulcrum members 31a, 31b compromises the ability of the end members 29a, 29b to separate and rotate, but one or both lever members allow a lifting force to further separate and rotate the end members 29a, 29b with respect to one another to effect removal of the apparatus 27. Elimination of both of the fulcrum members 31a, 31b and both of the lever members 32a, 32b still yields an apparatus that is disengagable without use of a tool (provided the projections 30a, 30b are sufficiently short), but the apparatus 27 can not be lifted from the assembly without a tool being used to provide a lifting force.

Figure 4:
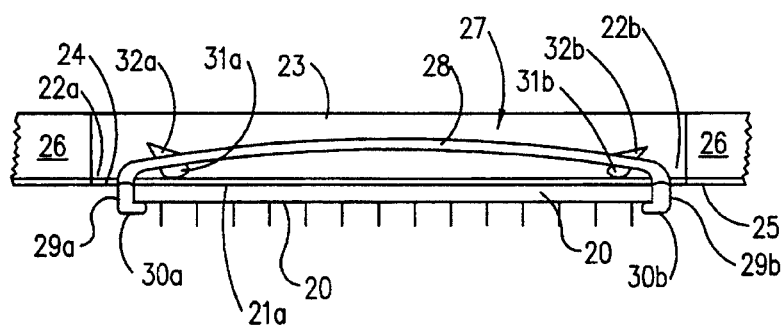
FIG. 4 illustrates an elevational view of an alternative embodiment of the retention apparatus of the present invention.

Turning now to FIG. 4, illustrated is an elevational view of an alternative embodiment of the retention apparatus of the present invention. In this embodiment, the radius of curvature of the arcuate portion 28 of the retention clip apparatus 27 has been made infinite. This yields a flat "arcuate" portion 28 and a lower profile for the apparatus 27 as a whole. The fulcrum members (31a, 31b of FIG. 3) have been eliminated. The effect of these two changes is to reduce the degree to which the end portions 29a, 29b are separated and rotated when downward force is exerted on the arcuate portion 28. However, one or both of the lever members 32a, 32b remain to allow a human digit to exert a lifting force thereon. This lifting force, in combination with the downward force on the arcuate portion 28, causes a bending of the arcuate portion 28 and a rotation of one or both of the end portions 29a, 29b. If the projections 30a, 30b are sufficiently short, the limited rotation of the end portions 29a, 29b is sufficient to disengage the apparatus 27 from the assembly.

In a preferred embodiment, the apparatus is formed of a spring steel, allowing the apparatus to be flexible while allowing for the apparatus to provide substantial spring force on the component to retain the heat sink reliably. The fulcrum member(s) and lever member(s) are likewise formed of steel and are either bonded or welded to the arcuate portion or are formed as an integral part of the arcuate portion itself. The fulcrum member(s) or the lever member(s) can be formed of plastic or other suitable materials, depending upon cost and strength considerations. In one embodiment, the fulcrum member(s) and lever member(s) are located at corresponding positions relative to the arcuate portion, such that a mounting post can pass through a hole in the arcuate portion to join the fulrum member(s) to the lever member(s).

Those skilled in the art will realize that the present invention is useful for retaining heat sinks to electronic components of all kinds, including non-CPU integrated circuits. As average temperatures within computer chasses rise and power densities of non-CPU components increase, the need for heat sinks will rise.

From the above disclosure, it is apparent that the present invention provides an apparatus and method for coupling a heat sink to a heat-producing electronic component, such as a microprocessor, into an assembly. The apparatus comprises: (1) a resilient clip member having a central, substantially arcuate portion of a selected radius of curvature, the arcuate portion thereby having a concave surface and a convex surface, the clip member further having an opposing pair of end portions bent with respect to the arcuate portion toward the concave surface, the end portions substantially parallel to one another, the end portions further including inwardly-facing projections for engaging with a lower surface of the component and (2) a fulcrum member coupled to a selected point on the concave surface of the clip member, the fulcrum member urging against an upper surface of the heat sink when pressure is applied to the convex surface of the arcuate portion, the arcuate portion flattening, the end members rotating outwardly with respect to one another to thereby disengage the inwardly-facing projections from the lower surface, the apparatus thereby free to be removed from the assembly.

Although the present invention and its advantages have been described in detail, it should be understood that various changes, substitutions and alterations can be made herein without departing from the spirit and scope of the invention as defined by the appended claims.

What is claimed is:

1. Retention apparatus for coupling an assembly having a lower surface and an upper surface, said apparatus comprising:
    a resilient clip member having a central, substantially arcuate portion of a selected radius of curvature, said arcuate portion thereby having a concave surface and a convex surface, said clip member further having an opposing pair of end portions bent with respect to said arcuate portion toward said concave surface, said end portions substantially parallel to one another, said end portions further including inwardly-facing projections for engaging with said lower surface; and
    a fulcrum member coupled to a selected point on said concave surface of said clip member, said fulcrum member urging against said upper surface when pressure is applied to said convex surface of said arcuate portion, said arcuate portion flattening, said end members rotating outwardly with respect to one another to thereby disengage said inwardly-facing projections from said lower surface, said apparatus thereby free to be removed from said assembly.

2. The apparatus as recited in claim 1 further comprising a lever member extending from said convex surface to thereby allow a lifting force to be exerted on said apparatus to assist in said removal of said apparatus from said assembly.

3. The apparatus as recited in claim 1 further comprising a second fulcrum member coupled to a second selected point on said concave surface of said clip member to thereby increase said outward rotation of said end portions with respect to one another when said pressure is applied.

4. The apparatus as recited in claim 1 wherein said lower surface is a lower surface of a heat-generating electronic component.

5. The apparatus as recited in claim 1 wherein said upper surface is an upper surface of a heat sink.

6. The apparatus as recited in claim 1 wherein said end portions extend through apertures in a heat sink.

7. The apparatus as recited in claim 1 wherein said apparatus is recessed between heat-dissipating projections of a heat sink when coupled to said assembly.

8. The apparatus as recited in claim 1 wherein said apparatus is formed of steel.

9. The apparatus as recited in claim 1 wherein said fulcrum member is formed of steel.

10. A method of removing a retention apparatus from an assembly having a lower surface and an upper surface, said method comprising the steps of:
    applying pressure to a convex surface of an arcuate portion of a clip member of said apparatus, said arcuate portion having a selected radius of curvature, said arcuate portion further having a concave surface and an opposing pair of end portions bent with respect to said arcuate portion toward said concave surface, said end portions substantially parallel to one another, said end portions further including inwardly-facing projections for engaging with said lower surface, said pressure causing a fulcrum member coupled to a selected point on said concave surface of said clip member to urge against said upper surface, said arcuate portion flattening, said end members rotating outwardly with respect to one another to thereby disengage said inwardly-facing projections from said lower surface, said apparatus thereby free to be removed from said assembly; and
    lifting said apparatus from said upper surface of said assembly to remove said apparatus.

11. The method as recited in claim 10 wherein said step of lifting comprises the step of exerting a lifting force on a lever member extending from said convex surface to assist in said removal of said apparatus from said assembly.

12. The method as recited in claim 10 wherein said apparatus further comprises a second fulcrum member coupled to a second selected point on said concave surface of said clip member to thereby increase said outward rotation of said end portions with respect to one another when said pressure is applied.

13. The method as recited in claim 10 wherein said lower surface is a lower surface of a heat-generating electronic component.

14. The method as recited in claim 10 wherein said upper surface is an upper surface of a heat sink.

15. The method as recited in claim 10 further comprising the step of lifting said end portions of said apparatus through apertures in a heat sink.

16. The method as recited in claim 10 wherein said apparatus is recessed between heat-dissipating projections of a heat sink when coupled to said assembly.

17. The method as recited in claim 10 wherein said apparatus is formed of steel.

18. The method as recited in claim 10 wherein said fulcrum member is formed of steel.

19. Retention apparatus for removably coupling a heat sink to an electronic component, said component having a lower surface and a substantially planar upper surface, said heat sink having an upper surface, a plurality of heat dissipating projections located on said upper surface and a substantially planar lower surface, said apparatus comprising:
    a resilient clip member having a central, substantially arcuate portion of a selected radius of curvature, said arcuate portion thereby having a concave surface and a convex surface, said clip member further having an opposing pair of end portions bent with respect to said arcuate portion toward said concave surface, said end portions substantially parallel to one another and separated from one another by a distance substantially equal to a dimension of said component, said end portions further including inwardly-facing projections for engaging with said lower surface of said component, said lower surface of said heat sink thereby thermally coupled to said upper surface of said component; and
    a fulcrum member coupled to a selected point on said concave surface of said clip member, said fulcrum member urging against said upper surface of said heat sink when pressure is applied to said convex surface of said arcuate portion, said arcuate portion flattening and lengthening, said end members separating and rotating outwardly with respect to one another to thereby disengage said inwardly-facing projections from said lower surface of said component, said apparatus thereby free to be removed from said assembly.

20. The apparatus as recited in claim 19 further comprising a lever member extending from said convex surface to thereby allow a lifting force to be exerted on said apparatus to assist in said removal of said apparatus from said assembly.

21. The apparatus as recited in claim 19 further comprising a second fulcrum member coupled to a second selected point on said concave surface of said clip member to thereby increase said outward rotation of said end portions with respect to one another when said pressure is applied.

22. The apparatus as recited in claim 19 wherein said end portions extend through apertures in a heat sink.

23. The apparatus as recited in claim 19 wherein said arcuate portion of said apparatus is recessed between said heat-dissipating projections when coupled to said assembly.

24. The apparatus as recited in claim 19 wherein said apparatus is formed of steel.

25. The apparatus as recited in claim 19 wherein said fulcrum member is formed of steel.

26. A method of removing a heat sink from an electronic component, said component having a lower surface and a substantially planar upper surface, said heat sink having an upper surface, a plurality of heat dissipating projections located on said upper surface and a substantially planar lower surface, said method comprising the steps of:

applying pressure to a convex surface of an arcuate portion of a clip member of said apparatus, said arcuate portion having a selected radius of curvature, said arcuate portion further having a concave surface and an opposing pair of end portions bent with respect to said arcuate portion toward said concave surface, said end portions substantially parallel to one another, said end portions further including inwardly-facing projections for engaging with said lower surface of said component, said pressure causing a fulcrum member coupled to a selected point on said concave surface of said clip member to urge against said upper surface of said heat sink, said arcuate portion flattening and lengthening, said end members separating and rotating outwardly with respect to one another to thereby disengage said inwardly-facing projections from said lower surface of said component, said apparatus thereby free to be removed from said assembly; and lifting said apparatus from said upper surface of said assembly to remove said apparatus.

27. The method as recited in claim 26 wherein said step of lifting comprises the step of exerting a lifting force on a lever member extending from said convex surface to assist in said removal of said apparatus from said assembly.

28. The method as recited in claim 26 wherein said apparatus further comprises a second fulcrum member coupled to a second selected point on said concave surface of said clip member to thereby increase said outward rotation of said end portions with respect to one another when said pressure is applied.

29. The method as recited in claim 26 further comprising the step of lifting said end portions of said apparatus through apertures in a heat sink.

30. The method as recited in claim 26 wherein said apparatus is recessed between heat-dissipating projections of a heat sink when coupled to said assembly.

31. The method as recited in claim 26 wherein said apparatus is formed of steel.

32. The method as recited in claim 26 wherein said fulcrum member is formed of steel.

* * * * *